(12) United States Patent
Choi

(10) Patent No.: US 12,396,337 B2
(45) Date of Patent: Aug. 19, 2025

(54) DISPLAY DEVICE

(71) Applicant: Samsung Display Co., Ltd., Yongin-Si (KR)

(72) Inventor: Junwon Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 536 days.

(21) Appl. No.: 17/720,140

(22) Filed: Apr. 13, 2022

(65) Prior Publication Data

US 2023/0006022 A1 Jan. 5, 2023

(30) Foreign Application Priority Data

Jul. 5, 2021 (KR) .................. 10-2021-0087815

(51) Int. Cl.
H10K 59/131 (2023.01)

(52) U.S. Cl.
CPC .................. H10K 59/131 (2023.02)

(58) Field of Classification Search
None
See application file for complete search history.

(56) References Cited

U.S. PATENT DOCUMENTS

| | | | |
|---|---|---|---|
| 2008/0087894 A1* | 4/2008 | Yamazaki | H10D 30/6744 257/E27.111 |
| 2009/0065780 A1* | 3/2009 | Yasukawa | H10D 30/6723 257/71 |
| 2019/0252479 A1* | 8/2019 | Kang | H10K 59/1213 |
| 2019/0341440 A1 | 11/2019 | Cha et al. | |
| 2020/0144309 A1* | 5/2020 | Jeon | H10D 86/60 |
| 2021/0134918 A1 | 5/2021 | Moon et al. | |
| 2022/0208914 A1* | 6/2022 | Lee | H01L 27/124 |

FOREIGN PATENT DOCUMENTS

| | | |
|---|---|---|
| KR | 10-2018-0112158 A | 10/2018 |
| KR | 10-2019-0128040 A | 11/2019 |
| KR | 10-2020-0052782 A | 5/2020 |
| KR | 10-2021-0055132 A | 5/2021 |

OTHER PUBLICATIONS

Ravichandran, G. (2008). Active Materials. In: Sharpe, W. (eds) Springer Handbook of Experimental Solid Mechanics. Springer Handbooks. Springer, Boston, MA. https://doi.org/10.1007/978-0-387-30877-7_6 (Year: 2008).*

* cited by examiner

Primary Examiner — Yara B Green
Assistant Examiner — Fakeha Sehar
(74) Attorney, Agent, or Firm — Innovation Counsel LLP

(57) ABSTRACT

A display device is disclosed that includes a first active layer, a gate pattern, a second active layer, and a lower conductive layer. The first active layer is disposed on a substrate. The gate pattern is disposed on the first active layer. The second active layer is disposed on the gate pattern and includes a body portion electrically connected to the gate pattern. The lower conductive layer is disposed between the substrate and the first active layer and includes a first region. At least a part of the first region overlaps an entirety of the body portion of the second active layer.

20 Claims, 13 Drawing Sheets

DISPLAY DEVICE

CROSS-REFERENCE TO RELATED APPLICATION(S)

This application claims priority under 35 USC § 119 to Korean Patent Application No. 10-2021-0087815 filed on Jul. 5, 2021 in the Korean Intellectual Property Office (KIPO), the entire disclosure of which is incorporated by reference herein.

BACKGROUND

1. Field

The present inventive concept relates to a display device. More particularly, the present inventive concept relates to a display device applied to various electronic apparatuses.

2. Description of the Related Art

A display device may include a plurality of pixels. Each of the pixels may include a light emitting element and a pixel circuit for controlling an electrical signal applied to the light emitting element. The pixel circuit may include a transistor, a capacitor, or the like.

The number of transistors and capacitors electrically connected to one light emitting element is increasing in order to accurately control whether the light emitting element emits light and the degree of light emission of the light emitting element. Accordingly, research for solving problems of high integration and power consumption of the display device is being actively conducted.

SUMMARY

A display device according to an embodiment may include a first active layer disposed on a substrate, a gate pattern disposed on the first active layer, a second active layer disposed on the gate pattern and including a body portion electrically connected to the gate pattern, and a lower conductive layer disposed between the substrate and the first active layer and including a first region, at least a part of the first region overlapping an entirety of the body portion of the second active layer.

In an embodiment, a width of the first region of the lower conductive layer in a first direction may be greater than a width of the body portion of the second active layer in the first direction.

In an embodiment, a width of the first region of the lower conductive layer in a second direction intersecting the first direction may be greater than a width of the body portion of the second active layer in the second direction.

In an embodiment, an area of the first region of the lower conductive layer may be greater than an area of the body portion of the second active layer.

In an embodiment, the display device may further include a write scan line disposed on the same layer as the gate pattern, extending in a first direction, and overlapping a part of the body portion of the second active layer.

In an embodiment, a width of the first region of the lower conductive layer in a second direction intersecting the first direction may be greater than a width of the write scan line in the second direction.

In an embodiment, the display device may further include a first scan line disposed on the same layer as the gate pattern and extending in a first direction, and a second scan line disposed on the second active layer and overlapping the first scan line.

In an embodiment, the second active layer may further include an extension portion extending in a second direction intersecting the first direction from the body portion and positioned between the first scan line and the second scan line.

In an embodiment, the display device may further include a gate connection electrode disposed on the second scan line and connecting the gate pattern and the body portion of the second active layer.

In an embodiment, the display device may further include an active connection electrode disposed on the same layer as the gate connection electrode and connecting the first active layer and the second active layer.

In an embodiment, the lower conductive layer may transmit a driving voltage.

In an embodiment, the lower conductive layer may further include a second region, at least a part of the second region overlapping an entirety of the gate pattern.

In an embodiment, a material of the first active layer may be different from a material of the second active layer.

In an embodiment, the first active layer may include at least one of amorphous silicon and polysilicon, and the second active layer may include an oxide semiconductor.

A display device according to an embodiment may include a first pixel disposed on a substrate, a second pixel disposed on the substrate and adjacent to the first pixel in a first direction, and a lower conductive layer disposed between the substrate and the first pixel and between the substrate and the second pixel. Each of the first pixel and the second pixel may include a first active layer disposed on the lower conductive layer, a gate pattern disposed on the first active layer, and a second active layer disposed on the gate pattern and including a body portion electrically connected to the gate pattern. The lower conductive layer may include a first region, at least a part of the first region overlapping an entirety of the body portion of the second active layer of the first pixel and an entirety of the body portion of the second active layer of the second pixel.

In an embodiment, a width of the first region of the lower conductive layer in the first direction may be greater than a sum of a width of the body portion of the second active layer of the first pixel in the first direction, a width of the body portion of the second active layer of the second pixel in the first direction, and a gap between the body portion of the second active layer of the first pixel and the body portion of the second active layer of the second pixel in the first direction.

In an embodiment, a width of the first region of the lower conductive layer in a second direction intersecting the first direction may be greater than a width of the body portion of the second active layer of the first pixel in the second direction and a width of the body portion of the second active layer of the second pixel in the second direction.

In an embodiment, an area of the first region of the lower conductive layer may be greater than a sum of an area of the body portion of the second active layer of the first pixel and an area of the body portion of the second active layer of the second pixel.

In an embodiment, the first pixel and the second pixel may be symmetrical with respect to a second direction intersecting the first direction.

In an embodiment, the lower conductive layer may further include a second region, at least a part of the second region overlapping an entirety of the gate pattern of the first pixel and an entirety of the gate pattern of the second pixel.

BRIEF DESCRIPTION OF THE DRAWINGS

Illustrative, non-limiting embodiments will be more clearly understood from the following detailed description taken in conjunction with the accompanying drawings.

DETAILED DESCRIPTION OF THE EMBODIMENTS

Embodiments provide a display device for preventing occurrence of stains. In the display device according to the embodiments, a lower conductive layer, which forms a storage capacitor with a second active layer, may include a first region at least a part of which overlaps an entirety of the body portion of the second active layer, so that deviation of the storage capacitor may decrease. This may reduce or substantially prevent occurrence of stains in the display device.

Hereinafter, display devices in accordance with embodiments will be explained in detail with reference to the accompanying drawings.

Figure 1:
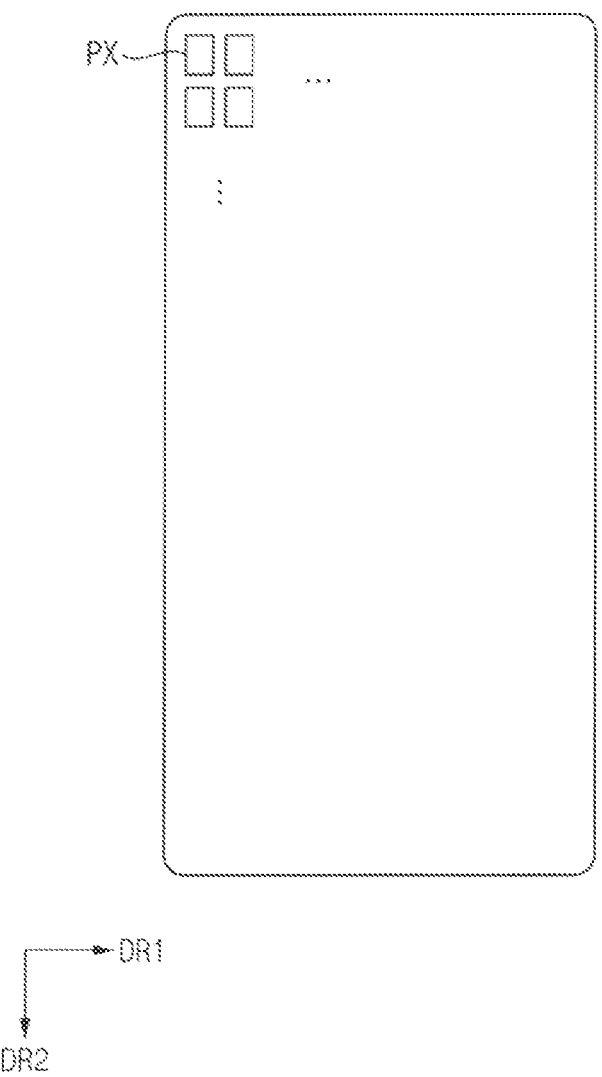
FIG. 1 is a plan view illustrating a display device according to an embodiment.

FIG. 1 is a plan view illustrating a display device according to an embodiment.

Referring to FIG. 1, a display device may include a plurality of pixels PX. Each pixel PX may mean a single region in which a display region is partitioned and defined on a plane for color display, and one pixel PX may display one predetermined basic color. In other words, one pixel PX may be a minimum unit capable of displaying colors independent of other pixels PX. The pixels PX may be arranged along a first direction DR1 and a second direction DR2 intersecting the first direction DR1. In an embodiment, the first direction DR1 and the second direction DR2 may be a pixel row direction and a pixel column direction, respectively. In another embodiment, the first direction DR1 and the second direction DR2 may be the pixel column direction and the pixel row direction, respectively.

Figure 2:
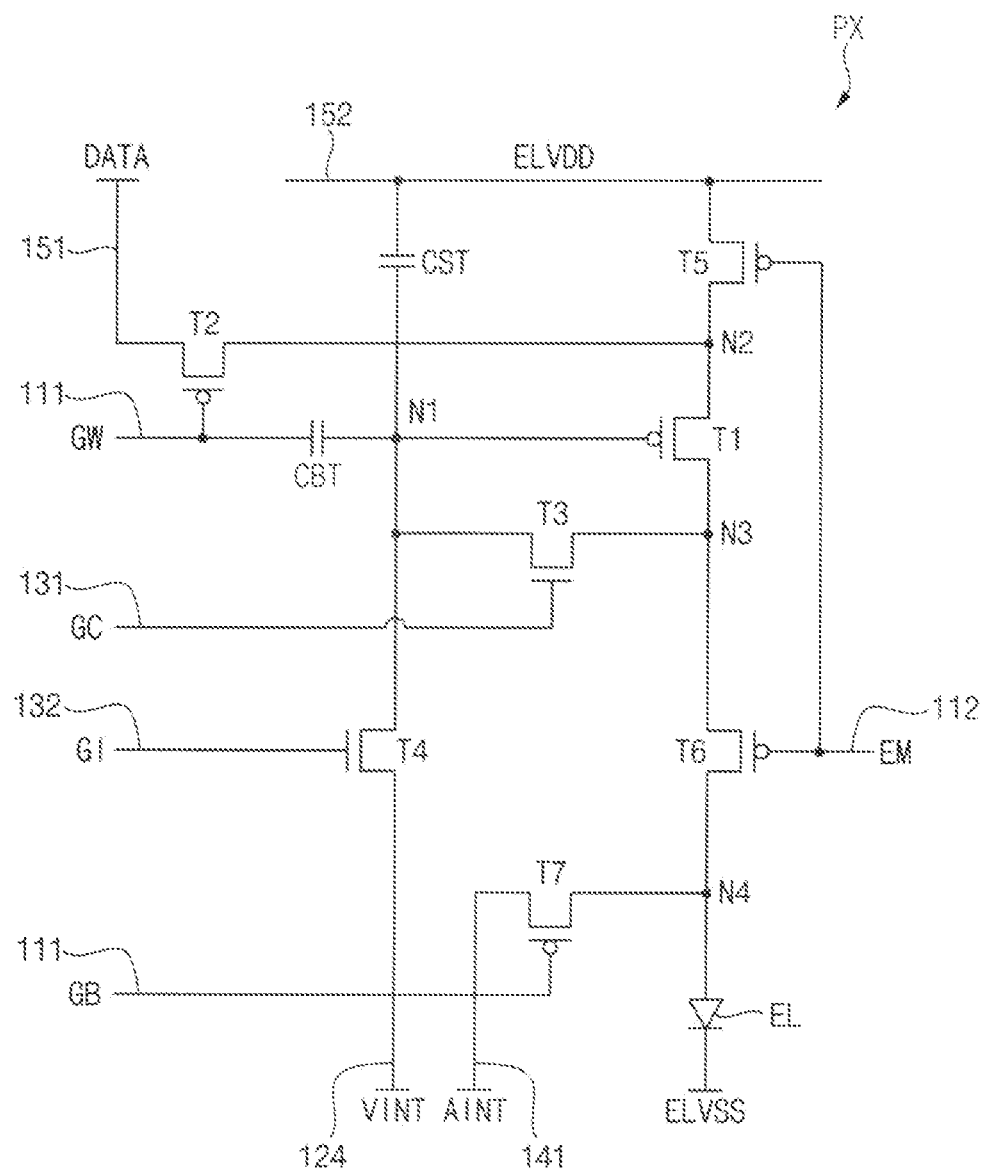
FIG. 2 is a circuit diagram illustrating a pixel of the display device in FIG. 1.

FIG. 2 is a circuit diagram illustrating the pixel PX of the display device in FIG. 1.

Referring to FIG. 2, the pixel PX may include a plurality of transistors, a storage capacitor CST, a boosting capacitor CBT, and a light emitting element EL. In an embodiment, the plurality of transistors may include a first transistor T1, a second transistor T2, a third transistor T3, a fourth transistor T4, a fifth transistor T5, a sixth transistor T6, and a seventh transistor T7. However, the present invention is not limited thereto, and in another embodiment, the plurality of transistors may include 2 to 6 or 8 or more transistors.

A gate electrode of the first transistor T1 may be connected to a first node N1. A first electrode of the first transistor T1 may be connected to a second node N2. A second electrode of the first transistor T1 may be connected to a third node N3. The first transistor T1 may generate a driving current based on a voltage between the first node N1 and the second node N2.

A gate electrode of the second transistor T2 may receive a write scan signal GW. The write scan signal GW may be applied through a write scan line 111. A first electrode of the second transistor T2 may receive a data voltage DATA. The data voltage DATA may be applied through a data line 151. A second electrode of the second transistor T2 may be connected to the second node N2. The second transistor T2 may transmit the data voltage DATA to the second node N2 based on the write scan signal GW.

A gate electrode of the third transistor T3 may receive a compensation scan signal GC. The compensation scan signal GC may be applied through a second compensation scan line 131. A first electrode of the third transistor T3 may be connected to the third node N3. A second electrode of the third transistor T3 may be connected to the first node N1. The third transistor T3 may compensate a threshold voltage of the first transistor T1 by connecting the first node N1 and the third node N3 based on the compensation scan signal GC.

A gate electrode of the fourth transistor T4 may receive an initialization scan signal GI. The initialization scan signal GI may be applied through a second initialization scan line 132. A first electrode of the fourth transistor T4 may receive a first initialization voltage VINT. The first initialization voltage VINT may be applied through a first initialization voltage line 124. A second electrode of the fourth transistor T4 may be connected to the first node N1. The fourth transistor T4 may initialize the gate electrode of the first transistor T1 by transmitting the first initialization voltage VINT to the first node N1 based on the initialization scan signal GI.

A gate electrode of the fifth transistor T5 may receive an emission control signal EM. The emission control signal EM may be applied through an emission control line 112. A first electrode of the fifth transistor T5 may receive a driving voltage ELVDD. The driving voltage ELVDD may be applied through a driving voltage line 152. A second electrode of the fifth transistor T5 may be connected to the second node N2.

A gate electrode of the sixth transistor T6 may receive the emission control signal EM. A first electrode of the sixth transistor T6 may be connected to the third node N3. A second electrode of the sixth transistor T6 may be connected to the fourth node N4. The fifth transistor T5 and the sixth transistor T6 may transmit the driving current generated by the first transistor T1 to the light emitting element EL based on the emission control signal EM.

A gate electrode of the seventh transistor T7 may receive a bypass scan signal GB. The bypass scan signal GB may be applied through the write scan line 111. A first electrode of the seventh transistor T7 may receive a second initialization voltage AINT. The second initialization voltage AINT may be applied through a second initialization voltage line 141. A second electrode of the seventh transistor T7 may be connected to the fourth node N4. In an embodiment, when the pixel PX is included in the N-th pixel row, the bypass scan signal GB may be the write scan signal GW applied to the (N+1)-th pixel row. The seventh transistor T7 may initialize the light emitting element EL by transmitting the second initialization voltage AINT to the fourth node N4 based on the bypass scan signal GB.

In an embodiment, each of the first transistor T1, the second transistor T2, the fifth transistor T5, the sixth transistor T6, and the seventh transistor T7 may be a transistor having a single gate structure, and each of the third transistor T3 and the fourth transistor T4 may be a transistor having a double gate structure. In such an embodiment, the gate electrode of each of the third transistor T3 and the fourth transistor T4 may include a lower gate electrode and an upper gate electrode, and the lower gate electrode and the upper gate electrode may be electrically connected to each other.

In an embodiment, an active layer of each of the first transistor T1, the second transistor T2, the fifth transistor T5, the sixth transistor T6, and the seventh transistor T7 may be formed of amorphous silicon or polysilicon, and an active layer of each of the third transistor T3 and the fourth transistor T4 may be formed of an oxide semiconductor. In an embodiment, each of the first transistor T1, the second transistor T2, the fifth transistor T5, the sixth transistor T6, and the seventh transistor T7 may be a PMOS transistor, and each of the third transistor T3 and the fourth transistor T4 may be an NMOS transistor.

A first electrode of the storage capacitor CST may receive the driving voltage ELVDD. A second electrode of the storage capacitor CST may be connected to the first node N1. The storage capacitor CST may maintain the voltage between the first node N1 and the second node N2 when the second transistor T2 is turned off, so that the light emitting element EL may emit light.

A first electrode of the boosting capacitor CBT may receive the write scan signal GW. A second electrode of the boosting capacitor CBT may be connected to the first node N1. The boosting capacitor CBT may increase the voltage of the first node N1 when the write scan signal GW has a voltage level that turns off the second transistor T2 to decrease a voltage for displaying black (black voltage). Accordingly, power consumption of the pixel PX may be reduced.

A first electrode of the light emitting element EL may be connected to the fourth node N4. A second electrode of the light emitting element EL may receive a common voltage ELVSS. In an embodiment, a voltage level of the common voltage ELVSS may be lower than a voltage level of the driving voltage ELVDD. The light emitting element EL may emit light based on the driving current.

Figure 3:
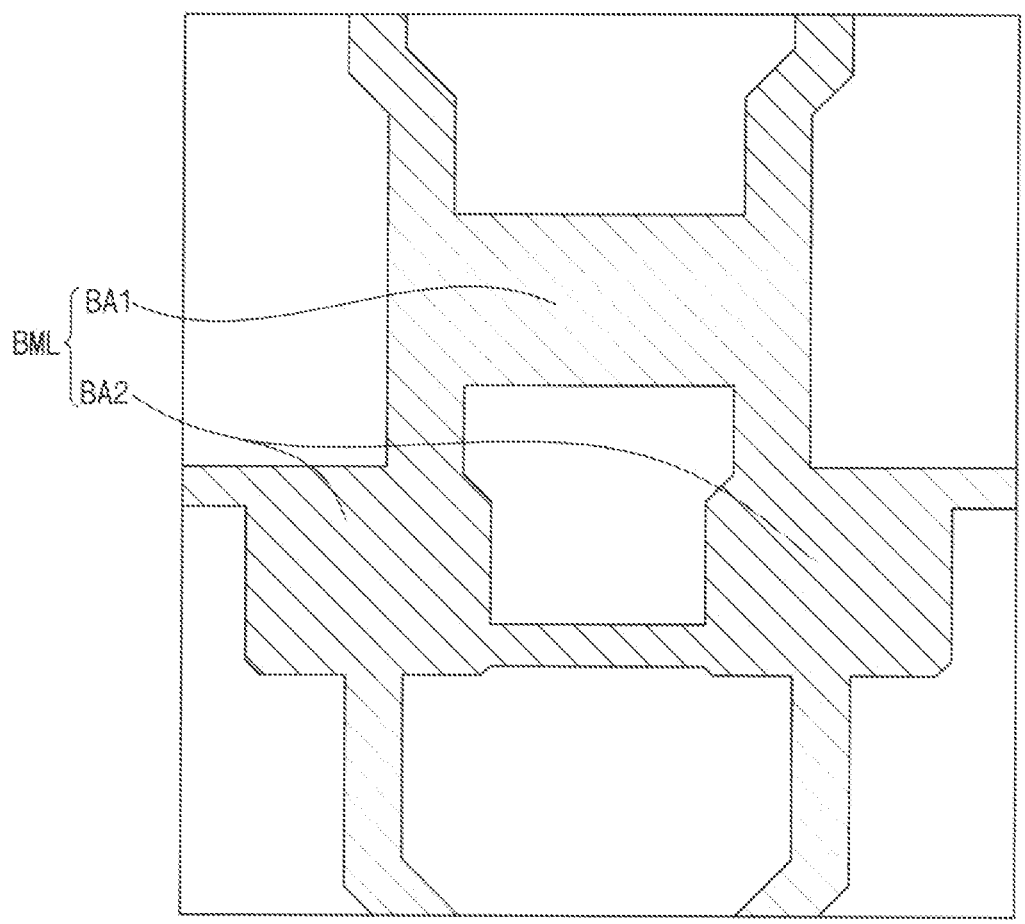
FIG. 3 is a plan view illustrating a lower conductive layer of the display device in FIG. 1.
Figure 4:
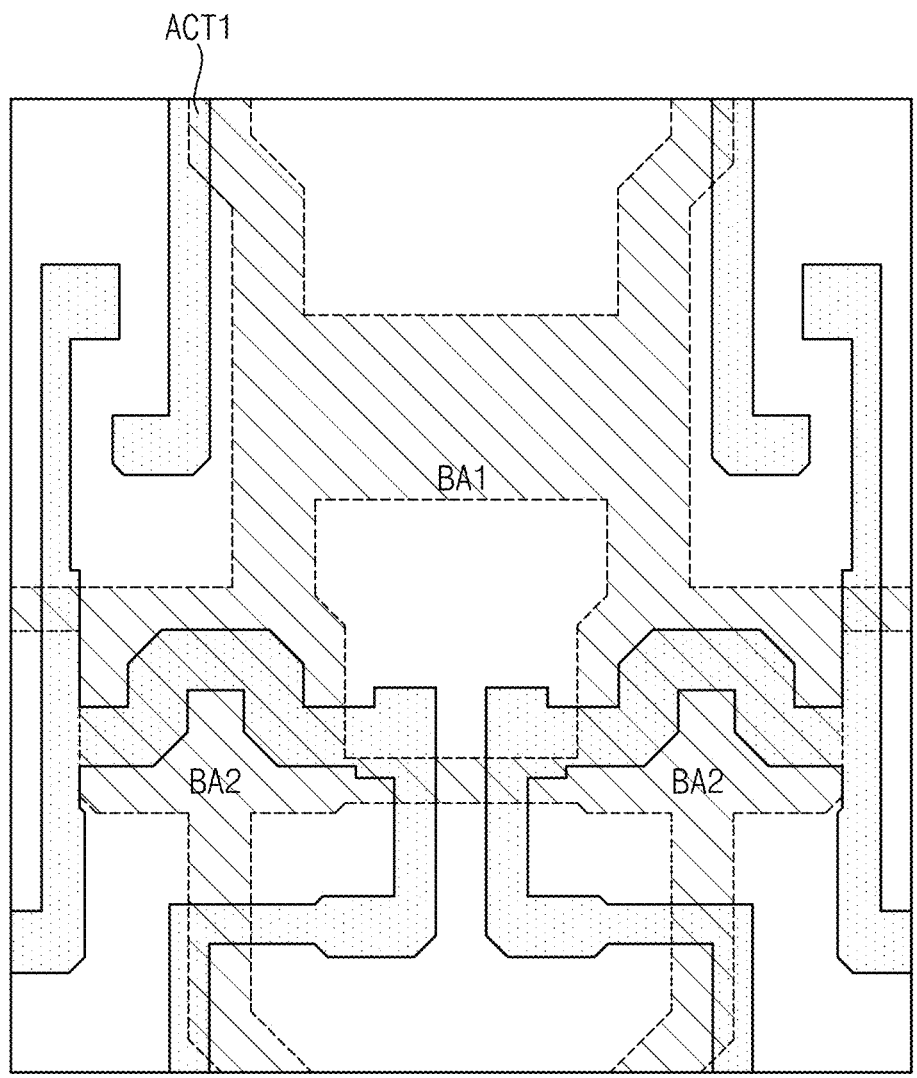
FIG. 4 is a plan view illustrating a first active layer and the lower conductive layer of the display device in FIG. 1.
Figure 5:
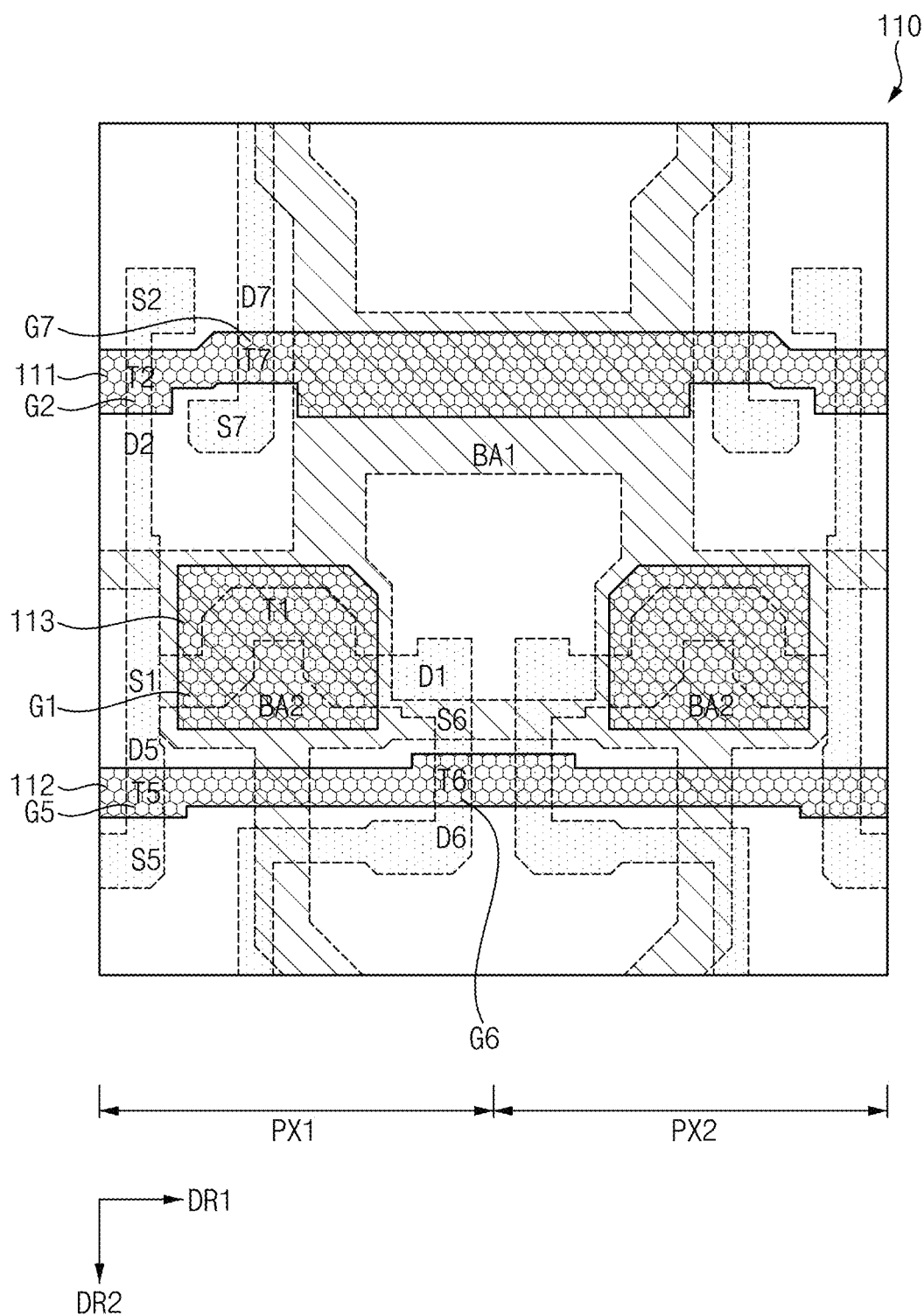
FIG. 5 is a plan view illustrating a first conductive layer, the first active layer, and the lower conductive layer of the display device in FIG. 1.
Figure 6:
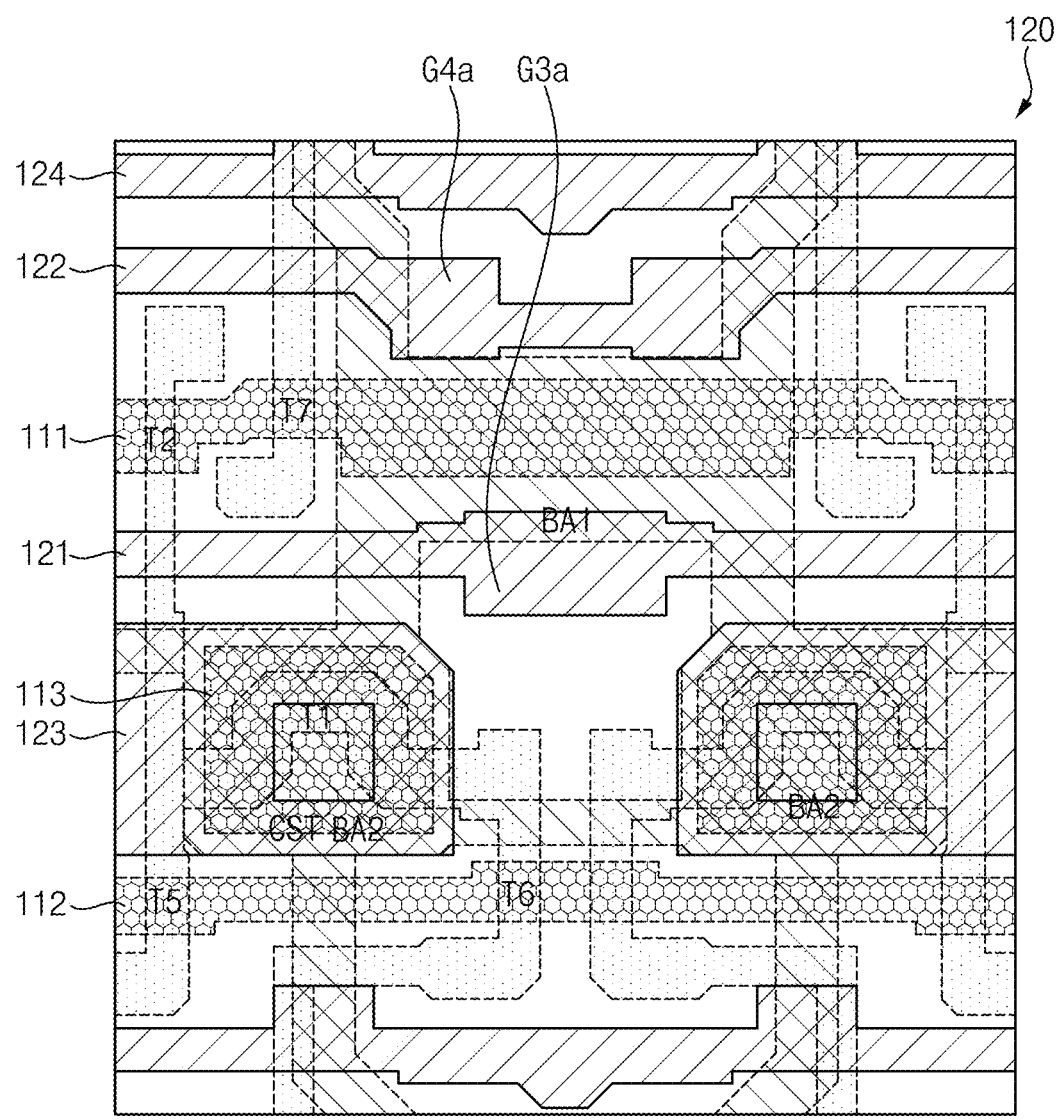
FIG. 6 is a plan view illustrating a second conductive layer, the first conductive layer, the first active layer, and the lower conductive layer of the display device in FIG. 1.
Figure 7:
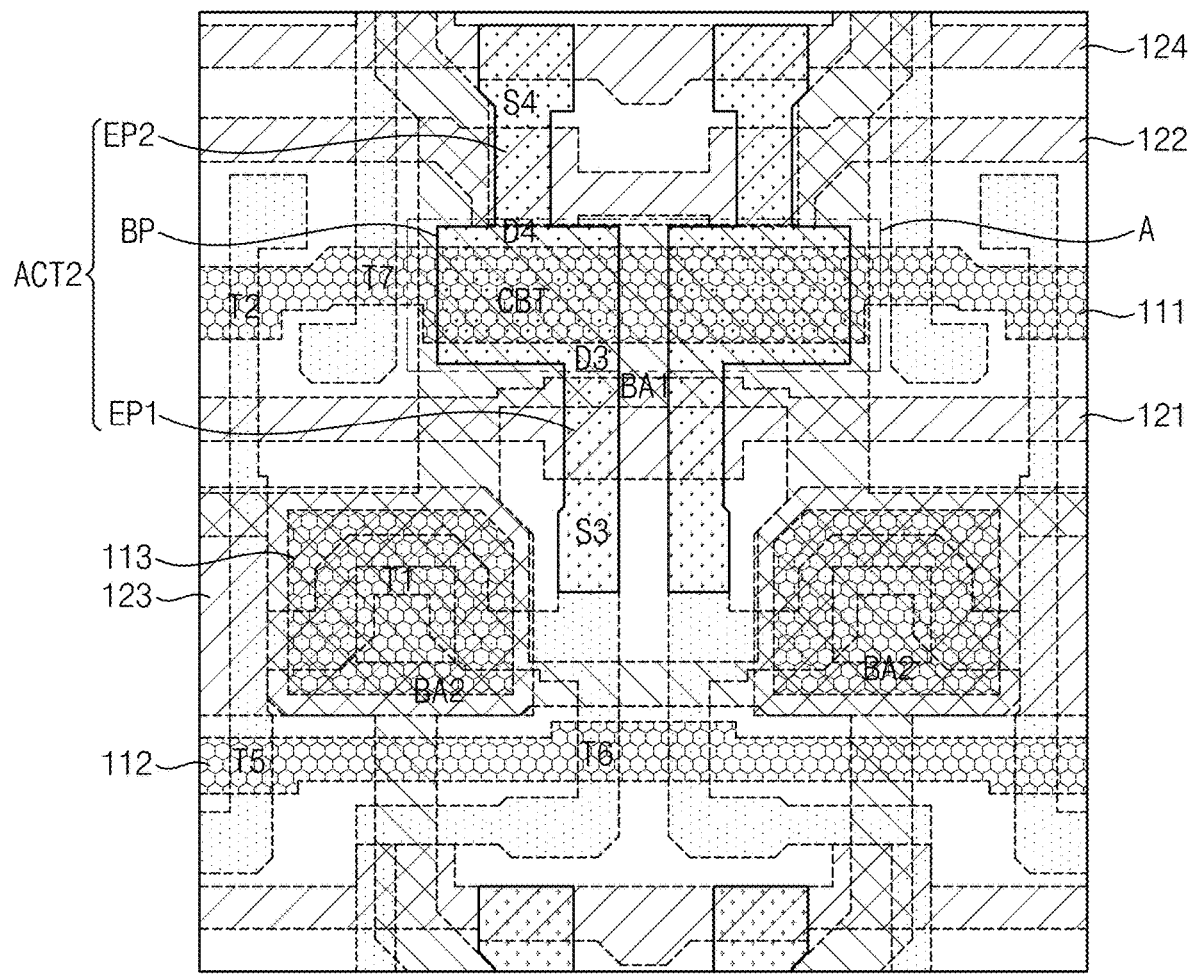
FIG. 7 is a plan view illustrating a second active layer, the second conductive layer, the first conductive layer, the first active layer, and the lower conductive layer of the display device in FIG. 1.
Figure 8:
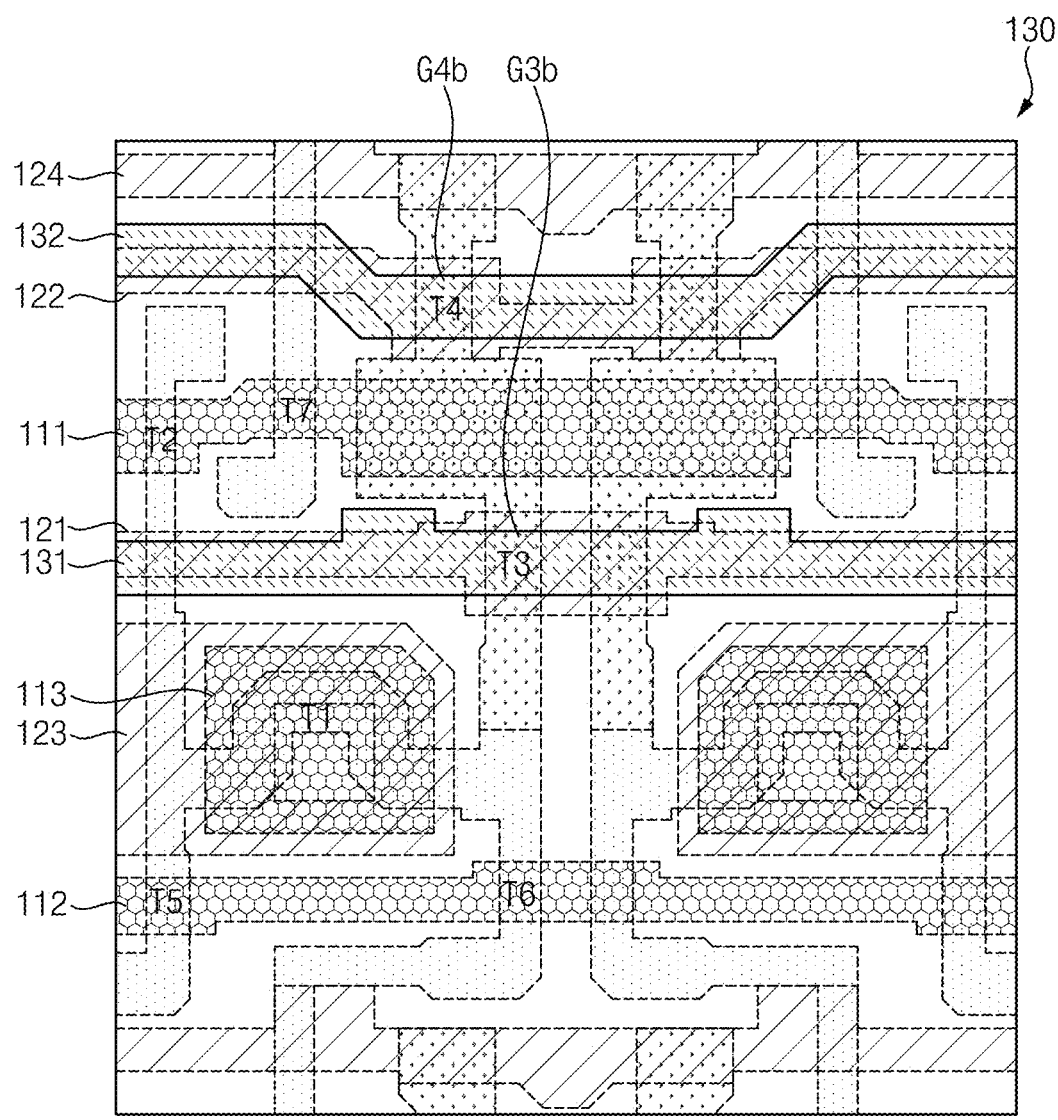
FIG. 8 is a plan view illustrating a third conductive layer, the second active layer, the second conductive layer, the first conductive layer, and the first active layer of the display device in FIG. 1.
Figure 9:
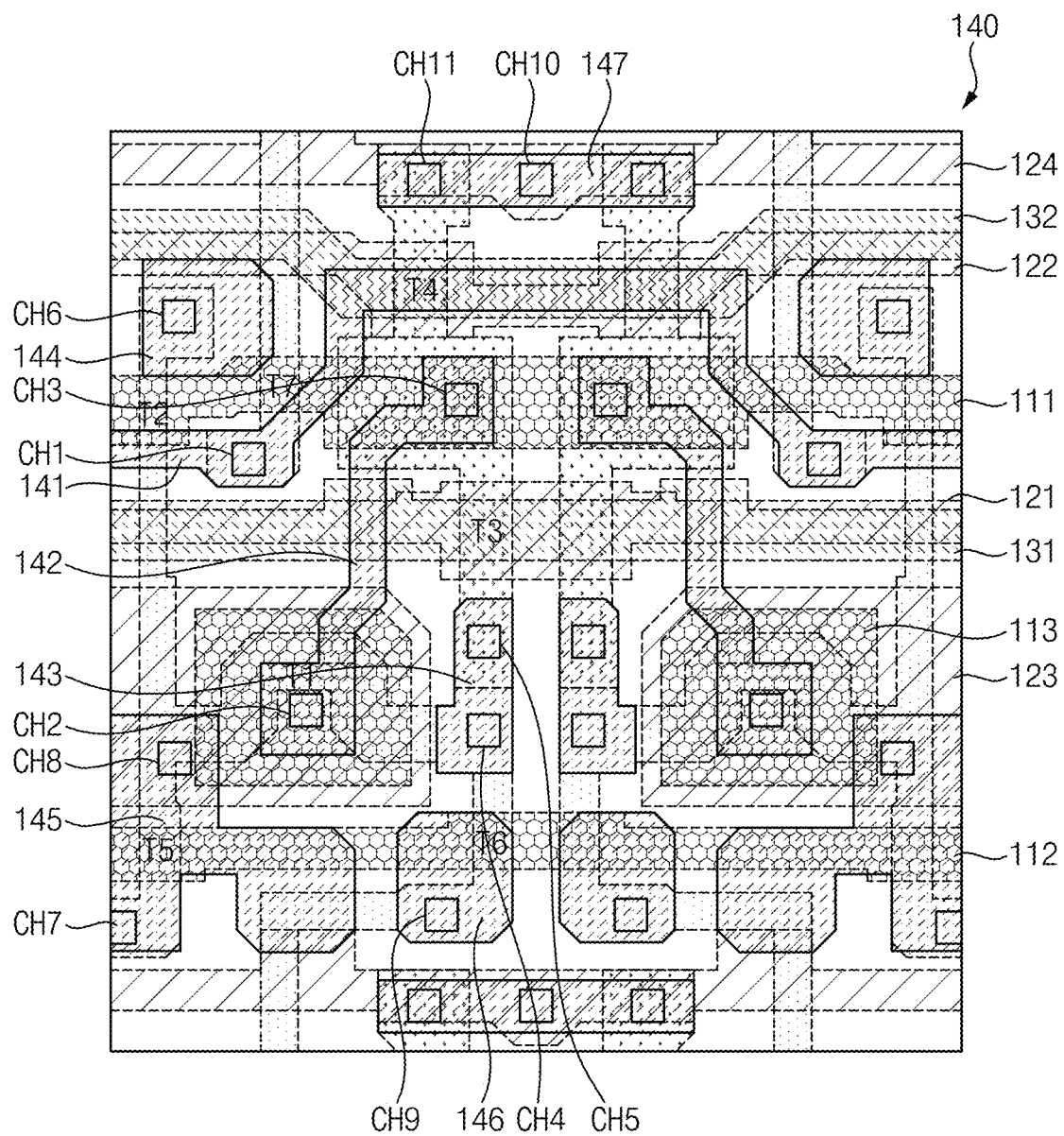
FIG. 9 is a plan view illustrating a fourth conductive layer, the third conductive layer, the second active layer, the second conductive layer, the first conductive layer, and the first active layer of the display device in FIG. 1.
Figure 10:
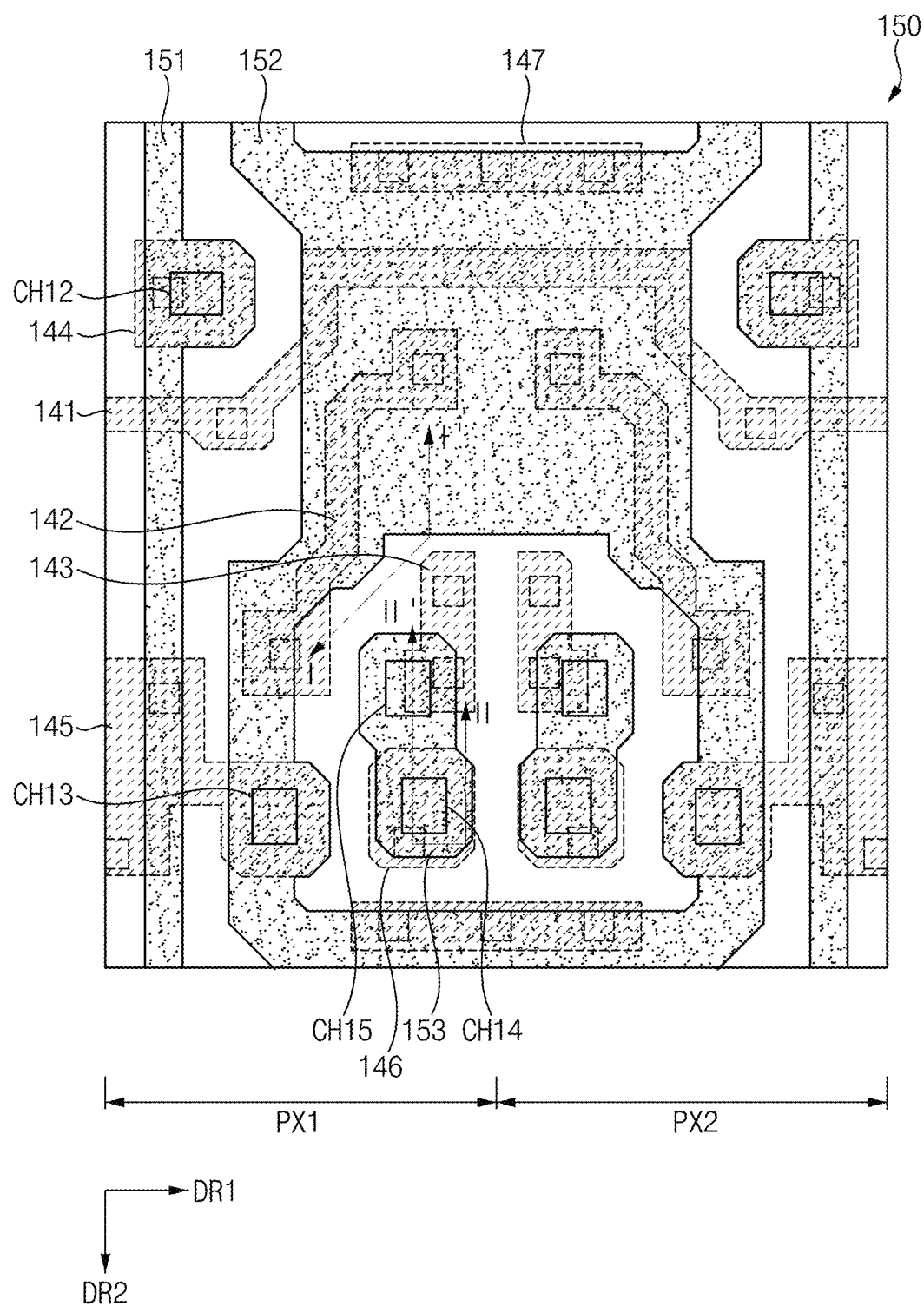
FIG. 10 is a plan view illustrating a fifth conductive layer and the fourth conductive layer of the display device in FIG. 1.
Figure 11:
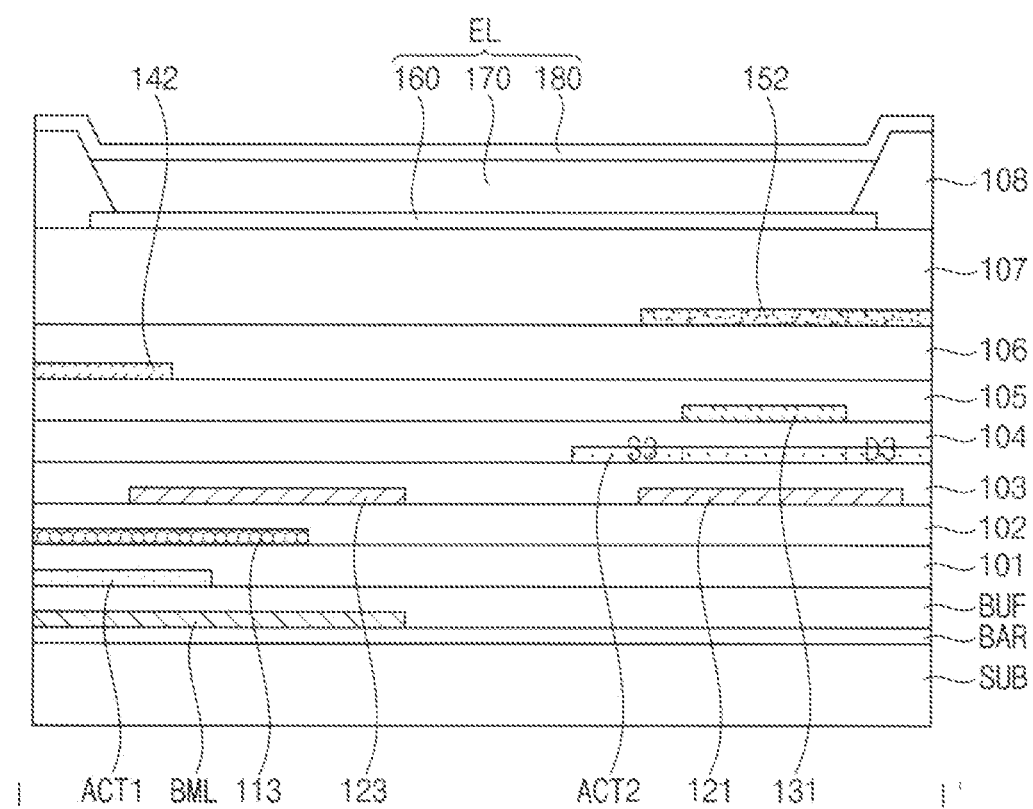
FIGS. 11 and 12 are cross-sectional views illustrating a display device according to an embodiment.
Figure 12:
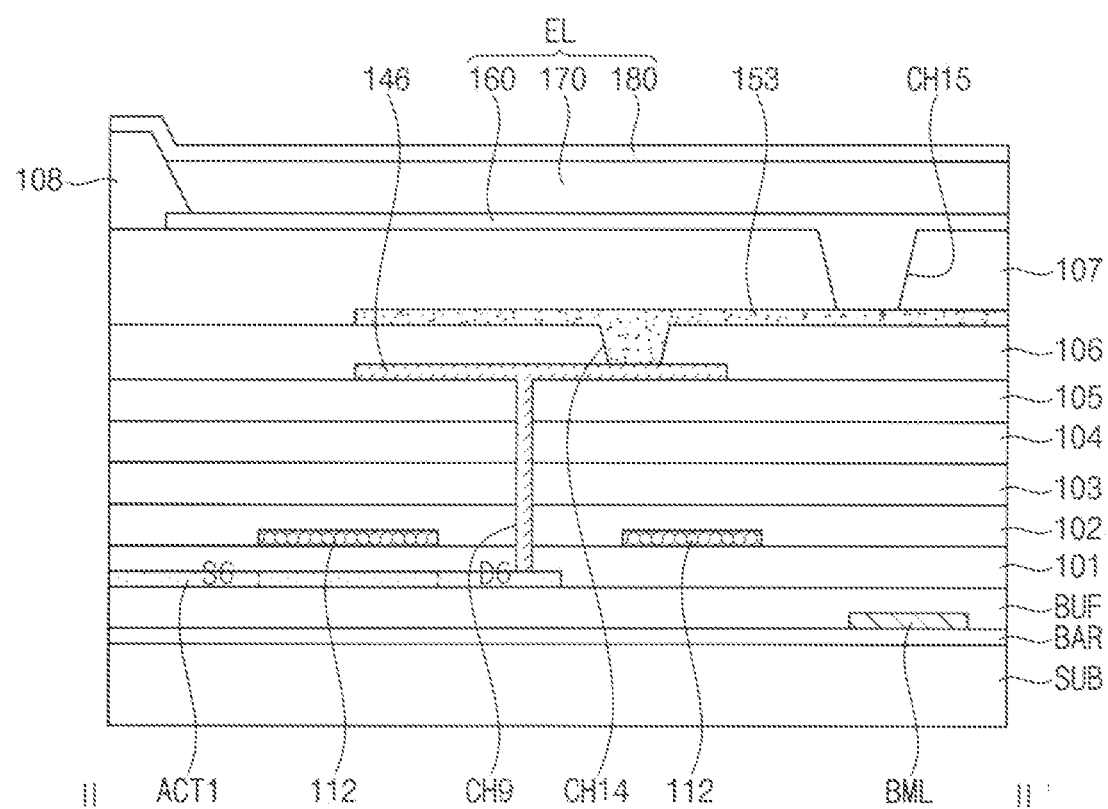

FIG. 3 is a plan view illustrating a lower conductive layer BML of the display device in FIG. 1. FIG. 4 is a plan view illustrating a first active layer ACT1 and the lower conductive layer BML of the display device in FIG. 1. FIG. 5 is a plan view illustrating a first conductive layer 110, the first active layer ACT1, and the lower conductive layer BML of the display device in FIG. 1. FIG. 6 is a plan view illustrating a second conductive layer 120, the first conductive layer 110, the first active layer ACT1, and the lower conductive layer BML of the display device in FIG. 1. FIG. 7 is a plan view illustrating a second active layer ACT2, the second conductive layer 120, the first conductive layer 110, the first active layer ACT1, and the lower conductive layer BML of the display device in FIG. 1. FIG. 8 is a plan view illustrating a third conductive layer 130, the second active layer ACT2, the second conductive layer 120, the first conductive layer 110, and the first active layer ACT1 of the display device in FIG. 1. FIG. 9 is a plan view illustrating a fourth conductive layer 140, the third conductive layer 130, the second active layer ACT2, the second conductive layer 120, the first conductive layer 110, and the first active layer ACT1 of the display device in FIG. 1. For convenience of illustration, illustration of the lower conductive layer BML is omitted in FIGS. 8 and 9. FIG. 10 is a plan view illustrating a fifth conductive layer 150 and the fourth conductive layer 140 of the display device in FIG. 1. For convenience of illustration, illustration of the third conductive layer 130, the second active layer ACT2, the second conductive layer 120, the first conductive layer 110, the first active layer ACT1, and the lower conductive layer BML is omitted in FIG. 10. FIGS. 11 and 12 are cross-sectional views illustrating a display device according to an embodiment. For example, FIG. 11 may illustrate the display device taken along line a I-I' in FIG. 10, and FIG. 12 may illustrate the display device taken along line a II-II' in FIG. 10.

Referring to FIGS. 3, 4, 5, 6, 7, 8, 9, 10, 11, and 12, the display device may include a lower conductive layer BML, a first pixel PX1, and a second pixel PX2 which are disposed on a substrate SUB.

The substrate SUB may be an insulating substrate including glass, quartz, plastic, or the like. In an embodiment, the substrate SUB may include a first organic layer, an inorganic layer disposed on the first organic layer, and a second organic layer disposed on the inorganic layer. The first organic layer and the second organic layer may include an organic insulating material such as polyimide (PI) or the like. The inorganic layer may include an inorganic insulating material such as silicon oxide, silicon nitride, amorphous silicon, or the like.

The lower conductive layer BML may be disposed on the substrate SUB. The lower conductive layer BML may include a conductive material such as molybdenum (Mo), copper (Cu), aluminum (Al), titanium (Ti), or the like.

The lower conductive layer BML may include a first region BA1 and a second region BA2. The second region BA2 may be spaced apart from the first region BA1, and may be connected to the first region BA1 through a wiring portion extending in the second direction DR2. In an embodiment, each of the first region BA1 and the second region BA2 may have a substantially rectangular planar shape. In an embodiment, the lower conductive layer BML may transmit the driving voltage ELVDD in FIG. 2.

A barrier layer BAR may be disposed between the substrate SUB and the lower conductive layer BML. The barrier layer BAR may block impurities such as oxygen, moisture, etc. from diffusing onto the substrate SUB through the substrate SUB. Further, the barrier layer BAR may provide a flat upper surface on the substrate SUB. The barrier layer BAR may include an inorganic insulating material such as silicon oxide, silicon nitride, silicon oxynitride, or the like. In an embodiment, the barrier layer BAR may have a multilayer structure including a plurality of inorganic insulating layers. Alternatively, the barrier layer BAR may be omitted.

The first pixel PX1 and the second pixel PX2 may be disposed on the lower conductive layer BML. The second pixel PX2 may be adjacent to the first pixel PX1 in the first direction DR1. In an embodiment, the first pixel PX1 and the second pixel PX2 may be symmetrical with respect to the second direction DR2. For example, the first pixel PX1 and the second pixel PX2 may be line-symmetric with respect to the second direction DR2.

Each of the first pixel PX1 and the second pixel PX2 may include a first active layer ACT1, a first conductive layer 110, a second conductive layer 120, a second active layer ACT2, a third conductive layer 130, a fourth conductive layer 140, a fifth conductive layer 150, a first electrode 160, an emission layer 170, and a second electrode 180. Since the components of the first pixel PX1 is substantially the same as or similar to those of the second pixel PX2, the components of the first pixel PX1 will be mainly described below.

The first active layer ACT1 may be disposed on the lower conductive layer BML.

A buffer layer BUF may be disposed between the lower conductive layer BML and the first active layer ACT1. The buffer layer BUF may block impurities such as oxygen, moisture, etc. from diffusing onto the substrate SUB through the substrate SUB. Further, the buffer layer BUF may provide a flat upper surface on the substrate SUB. The buffer layer BUF may include an inorganic insulating material such as silicon oxide, silicon nitride, silicon oxynitride, or the like.

The first conductive layer 110 may be disposed on the first active layer ACT1. The first conductive layer 110 may include a conductive material such as molybdenum (Mo), copper (Cu), aluminum (Al), titanium (Ti), or the like.

The first conductive layer 110 may include a write scan line 111, an emission control line 112, and a gate pattern 113. The write scan line 111 may extend in the first direction DR1. The emission control line 112 may be spaced apart from the write scan line 111, and may extend in the first direction DR1. The gate pattern 113 may be positioned between the write scan line 111 and the emission control line 112.

A first part of the write scan line 111 overlapping the first active layer ACT1 may form the gate electrode G2 of the second transistor T2. A second part of the write scan line 111 overlapping the first active layer ACT1 may form the gate electrode G7 of the seventh transistor T7. In an embodiment, when the pixel PX is included in an N-th pixel row, the second part of the write scan line 111 may form the gate electrode of the seventh transistor T7 of a pixel included in an (N−1)-th pixel row. A part of the first active layer ACT1 overlapping the gate electrode G2 of the second transistor T2 may be a channel of the second transistor T2. The first electrode S2 and the second electrode D2 of the second transistor T2 may be formed in the first active layer ACT1 with the channel of the second transistor T2 interposed therebetween. A part of the first active layer ACT1 overlapping the gate electrode G7 of the seventh transistor T7 may be a channel of the seventh transistor T7. The first electrode S7 and the second electrode D7 of the seventh transistor T7 may be formed in the first active layer ACT1 with the channel of the seventh transistor T7 interposed therebetween.

A first part of the emission control line 112 overlapping the first active layer ACT1 may form the gate electrode G5 of the fifth transistor T5. A second part of the emission control line 112 overlapping the first active layer ACT1 may form the gate electrode G6 of the sixth transistor T6. A part of the first active layer ACT1 overlapping the gate electrode G5 of the fifth transistor T5 may be a channel of the fifth transistor T5. The first electrode S5 and the second electrode D5 of the fifth transistor T5 may be formed in the first active layer ACT1 with the channel of the fifth transistor T5 interposed therebetween. A part of the first active layer ACT1 overlapping the gate electrode G6 of the sixth transistor T6 may be a channel of the sixth transistor T6. The first electrode S6 and the second electrode D6 of the sixth transistor T6 may be formed in the first active layer ACT1 with the channel of the sixth transistor T6 interposed therebetween.

A part of the gate pattern 113 overlapping the first active layer ACT1 may form the gate electrode G1 of the first transistor T1. A part of the first active layer ACT1 overlapping the gate electrode G1 of the first transistor T1 may be a channel of the first transistor T1. The first electrode S1 and the second electrode D1 of the first transistor T1 may be formed in the first active layer ACT1 with the channel of the first transistor T1 interposed therebetween.

At least a part of the second region BA2 of the lower conductive layer BML may overlap an entirety of the gate pattern 113. For example, the second region BA2 of the lower conductive layer BML may include a part overlapping the gate pattern 113 and another part not overlapping the gate pattern 113. In an embodiment, at least a part of the second region BA2 of the lower conductive layer BML may overlap an entirety of the gate pattern 113 of the first pixel PX1 and an entirety of the gate pattern 113 of the second pixel PX2. The second region BA2 of the lower conductive layer BML may be disposed under the first transistor T1. Specifically, the second region BA2 of the lower conductive layer BML may be disposed under a part of the first active layer ACT1 overlapping the gate pattern 113.

When an electric field due to the polarization of the first organic layer or the second organic layer of the substrate SUB which includes polyimide is formed between the first transistor T1 and the substrate SUB through under the first transistor T1, the characteristics of the first transistor T1 may be changed by the electric field, so that the brightness of light emitted from the light emitting element EL may be changed. When the lower conductive layer BML is disposed under the part of the first active layer ACT1 overlapping the gate pattern 113, the lower conductive layer BML may block the formation of the electric field between the first active layer ACT1 and the substrate SUB through under the first transistor T1. Accordingly, the characteristic of the first transistor T1 may not change, and the brightness of the light emitted from the light emitting element EL may constantly maintain. Further, when the lower conductive layer BML is disposed under the part of the first active layer ACT1 overlapping the gate pattern 113, the lower conductive layer BML may block the inflow of external light through under the first active layer ACT1. Accordingly, the characteristic of the first active layer ACT1 may not be changed.

A first insulating layer 101 may be disposed between the first active layer ACT1 and the first conductive layer 110. The first insulating layer 101 may include an inorganic insulating material such as silicon oxide, silicon nitride, silicon oxynitride, or the like.

The second conductive layer 120 may be disposed on the first conductive layer 110. The second conductive layer 120 may include a conductive material such as molybdenum (Mo), copper (Cu), aluminum (Al), titanium (Ti), or the like.

The second conductive layer 120 may include a first compensation scan line 121, a first initialization scan line 122, a storage pattern 123, and a first initialization voltage line 124. The first compensation scan line 121 may extend in the first direction DR1. The first initialization scan line 122 may be spaced apart from the first compensation scan line 121, and may extend in the first direction DR1. The storage pattern 123 may be spaced apart from the first compensation scan line 121. The first initialization voltage line 124 may be spaced apart from the first initialization scan line 122, and may extend in the first direction DR1.

Figure 13:
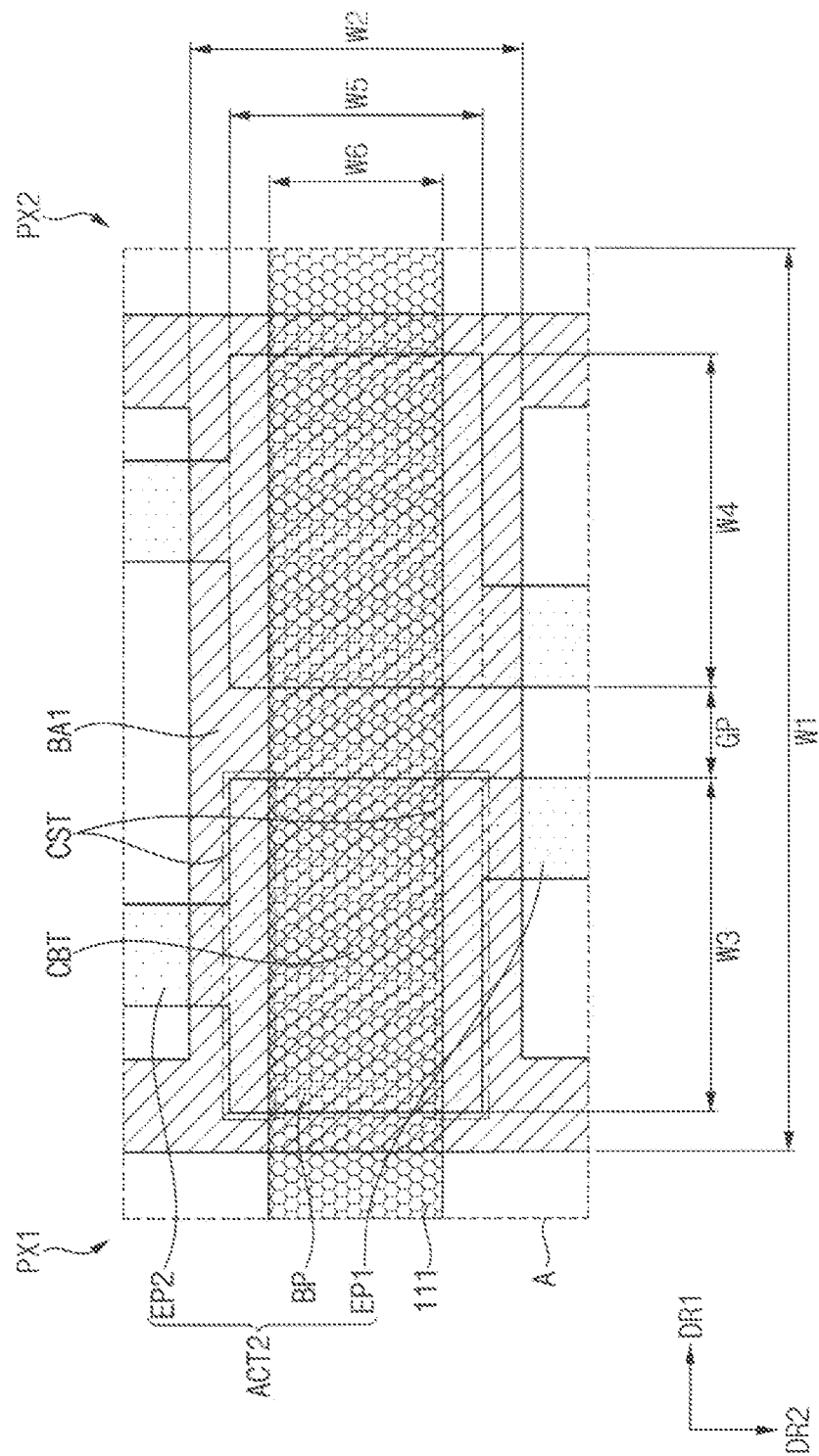
FIG. 13 is a plan view illustrating an area A in FIG. 7.

The storage pattern 123 may overlap the gate pattern 113. In an embodiment, the gate pattern 113 and the storage pattern 123 may form the storage capacitor CST in a region where the gate pattern 113 and the storage pattern 123 overlap. In an embodiment, the lower conductive layer BML and the second active layer ACT2 may form the storage capacitor CST (FIG. 13).

A second insulating layer 102 may be disposed between the first conductive layer 110 and the second conductive layer 120. The second insulating layer 102 may include an inorganic insulating material such as silicon oxide, silicon nitride, silicon oxynitride, or the like.

The second active layer ACT2 may be disposed on the second conductive layer 120. The second active layer ACT2 may not overlap the first active layer ACT1. A material of the first active layer ACT1 may be different from a material of the second active layer ACT2. In an embodiment, the first active layer ACT1 may include at least one of amorphous silicon and polysilicon, and the second active layer ACT2 may include an oxide semiconductor. However, the present invention is not limited thereto, and in another embodiment, the first active layer ACT1 may include an oxide semiconductor, and the second active layer ACT2 may include at least one of amorphous silicon and poly silicon.

The second active layer ACT2 may include a body portion BP, a first extension portion EP1, and a second extension portion EP2. The body portion BP may be electrically connected to the gate pattern 113. The first extension portion EP1 may extend from the body portion BP in the second direction DR2. The second extension portion EP2 may extend from the body portion BP in a direction opposite to the second direction DR2. A width of the body portion BP in the first direction DR1 may be greater than a width of the first extension portion EP1 in the first direction DR1 and a width of the second extension portion EP2 in the first direction DR1.

The second active layer ACT2 may overlap the write scan line 111. In an embodiment, the write scan line 111 may overlap at least a part of the body portion BP of the second active layer ACT2. The write scan line 111 and the second active layer ACT2 may form the boosting capacitor CBT in a region where the write scan line 111 and the second active layer ACT2 overlap.

A third insulating layer 103 may be disposed between the second conductive layer 120 and the second active layer ACT2. The third insulating layer 103 may include an inorganic insulating material such as silicon oxide, silicon nitride, silicon oxynitride, or the like.

The third conductive layer 130 may be disposed on the second active layer ACT2. The third conductive layer 130 may include a conductive material such as molybdenum (Mo), copper (Cu), aluminum (Al), titanium (Ti), or the like.

The third conductive layer 130 may include a second compensation scan line 131 and a second initialization scan line 132. The second compensation scan line 131 may extend in the first direction DR1. The second initialization scan line 132 may be spaced apart from the second compensation scan line 131, and may extend in the first direction DR1. The second compensation scan line 131 and the second initialization scan line 132 may overlap the first compensation scan line 121 and the first initialization scan line 122, respectively.

The first extension portion EP1 of the second active layer ACT2 may be positioned between the first compensation scan line 121 and the second compensation scan line 131. A part of the first compensation scan line 121 overlapping the first extension portion EP1 of the second active layer ACT2 may form the lower gate electrode G3a of the third transistor T3. A part of the second compensation scan line 131 overlapping the first extension portion EP1 of the second active layer ACT2 may form the upper gate electrode G3b of the third transistor T3. A part of the first extension portion EP1 of the second active layer ACT2 overlapping the lower gate electrode G3a and the upper gate electrode G3a of the third transistor T3 may be the channel of the third transistor T3. The first electrode S3 and the second electrode D3 of the third transistor T3 may be formed in the second active layer ACT2 with the channel of the third transistor T3 interposed therebetween. The third transistor T3 may be a transistor having a double gate structure.

The second extension portion EP2 of the second active layer ACT2 may be positioned between the first initialization scan line 122 and the second initialization scan line 132. A part of the first initialization scan line 122 overlapping the second extension portion EP2 of the second active layer ACT2 may form the lower gate electrode G4a of the fourth transistor T4. A part of the second initialization control line 132 overlapping the second extension portion EP2 of the second active layer ACT2 may form the upper gate electrode G4b of the fourth transistor T4. A part of the second extension portion EP2 of the second active layer ACT2 overlapping the lower gate electrode G4a and the upper gate electrode G4b of the fourth transistor T4 may be the channel of the fourth transistor T4. The first electrode S4 and the second electrode D4 of the fourth transistor T4 may be formed in the second active layer ACT2 with the channel of the fourth transistor T4 interposed therebetween. The fourth transistor T4 may be a transistor having a double gate structure.

A fourth insulating layer 104 may be disposed between the second active layer ACT2 and the third conductive layer 130. The fourth insulating layer 104 may include an inorganic insulating material such as silicon oxide, silicon nitride, silicon oxynitride, or the like.

The fourth conductive layer 140 may be disposed on the third conductive layer 130. The fourth conductive layer 140 may include a conductive material such as aluminum (Al), titanium (Ti), copper (Cu), or the like. In an embodiment, the fourth conductive layer 140 may have a multilayer structure including a titanium layer, an aluminum layer, and a titanium layer which are stacked.

The fourth conductive layer 140 may include a second initialization voltage line 141, a gate connection electrode 142, an active connection electrode 143, a data connection electrode 144, a driving voltage connection electrode 145, a first light emitting element connection electrode 146, and a first initialization voltage connection electrode 147. The second initialization voltage line 141 may extend in the first direction DR1. The second initialization voltage line 141 may be connected to the first active layer ACT1 through a contact hole CH1. Specifically, the second initialization voltage line 141 may be connected to the first electrode S7 of the seventh transistor T7.

The gate connection electrode 142 may be spaced apart from the second initialization voltage line 141. The gate connection electrode 142 may be connected to the gate pattern 113 and the body portion BP of the second active layer ACT2 through contact holes CH2 and CH3, respectively. Specifically, the gate connection electrode 142 may connect the gate electrode G1 of the first transistor T1 to the second electrode D3 of the third transistor T3 and the second electrode D4 of the fourth transistor T4.

The active connection electrode 143 may be spaced apart from the gate connection electrode 142. The active connection electrode 143 may be connected to the first active layer ACT1 and the first extension portion EP1 of the second active layer ACT2 through contact holes CH4 and CH5, respectively. Specifically, the active connection electrode 143 may connect the second electrode D1 of the first transistor T1 and the first electrode S6 of the sixth transistor T6 to the first electrode S3 of the third transistor T3.

The data connection electrode 144 may be spaced apart from the active connection electrode 143. The data connection electrode 144 may be connected to the first active layer ACT1 through a contact hole CH6. Specifically, the data connection electrode 144 may be connected to the first electrode S2 of the second transistor T2.

The driving voltage connection electrode 145 may be spaced apart from the data connection electrode 144. The driving voltage connection electrode 145 may be connected to the first active layer ACT1 and the storage pattern 123 through contact holes CH7 and CH8, respectively. Specifically, the driving voltage connection electrode 145 may be connected to the first electrode S5 of the fifth transistor T5 and the first electrode of the storage capacitor CST.

The first light emitting element connection electrode 146 may be spaced apart from the driving voltage connection electrode 145. The first light emitting element connection electrode 146 may be connected to the first active layer ACT1 through a contact hole CH9. Specifically, the first light emitting element connection electrode 146 may be connected to the second electrode D6 of the sixth transistor T6.

The first initialization voltage connection electrode 147 may be spaced apart from the first light emitting element connection electrode 146. The first initialization voltage connection electrode 147 may be connected to the first initialization voltage line 124 and the second extension portion EP2 of the second active layer ACT2 through contact holes CH10 and CH11, respectively. Specifically, the first initialization voltage connection electrode 147 may be connected to the first electrode S4 of the fourth transistor T4.

A fifth insulating layer 105 may be disposed between the third conductive layer 130 and the fourth conductive layer 140. The fifth insulating layer 105 may include an inorganic insulating material such as silicon oxide, silicon nitride, silicon oxynitride, etc. and/or an organic insulating material such as polyimide (PI), etc.

The fifth conductive layer 150 may be disposed on the fourth conductive layer 140. The fifth conductive layer 150 may include a conductive material such as aluminum (Al), titanium (Ti), copper (Cu), or the like. In an embodiment, the fifth conductive layer 150 may have a multilayer structure including a titanium layer, an aluminum layer, and a titanium layer, which are stacked.

The fifth conductive layer 150 may include a data line 151, a driving voltage line 152, and a second light emitting element connection electrode 153. The data line 151 may extend in the second direction DR2. The data line 151 may be connected to the data connection electrode 144 through a contact hole CH12. Accordingly, the data line 151 may be connected to the first electrode S2 of the second transistor T2 by the data connection electrode 144.

The driving voltage line 152 may be spaced apart from the data line 151, and may extend in the second direction DR2. The driving voltage line 152 may be connected to the driving voltage connection electrode 145 through a contact hole CH13. Accordingly, the driving voltage line 152 may be connected to the first electrode S5 of the fifth transistor T5 and the first electrode of the storage capacitor CST by the driving voltage connection electrode 145.

The second light emitting element connection electrode 153 may be spaced apart from the driving voltage line 152. The second light emitting element connection electrode 153 may be connected to the first light emitting element connection electrode 146 through a contact hole CH14.

A sixth insulating layer 106 may be disposed between the fourth conductive layer 140 and the fifth conductive layer 150. The sixth insulating layer 106 may include an inorganic insulating material such as silicon oxide, silicon nitride, silicon oxynitride, etc. and/or an organic insulating material such as polyimide (PI), etc.

The first electrode 160 may be disposed on the fifth conductive layer 150. The first electrode 160 may include a conductive material such as a metal, an alloy, a transparent conductive oxide, or the like. For example, the first electrode 160 may include silver (Ag), indium tin oxide (ITO), or the like. In an embodiment, the first electrode 160 may have a multilayer structure including an indium tin oxide layer, a silver layer, and an indium tin oxide layer, which are stacked.

The first electrode 160 may be connected to the second light emitting element connection electrode 153 through a contact hole CH15. Accordingly, the first electrode 160 may be connected to the second electrode D6 of the sixth transistor T6 by the first light emitting element connection electrode 146 and the second light emitting element connection electrode 153.

A seventh insulating layer 107 may be disposed between the fifth conductive layer 150 and the first electrode 160. The seventh insulating layer 107 may include an inorganic insulating material such as silicon oxide, silicon nitride, silicon oxynitride, etc. and/or an organic insulating material such as polyimide (PI), etc.

An eighth insulating layer 108 may be disposed on the first electrode 160. The eighth insulating layer 108 may cover the first electrode 160, and may be disposed on the seventh insulating layer 107. The eighth insulating layer 108 may have a pixel opening exposing at least a part of the first electrode 160. In an embodiment, the pixel opening may expose a central part of the first electrode 160, and the eighth insulating layer 108 may cover a peripheral part of the first electrode 160. The eighth insulating layer 108 may include an organic insulating material such as polyimide (PI) or the like.

The emission layer 170 may be disposed on the first electrode 160. The emission layer 170 may be disposed on the first electrode 160 exposed by the pixel opening. The emission layer 170 may include at least one of an organic light emitting material and a quantum dot.

In an embodiment, the organic light emitting material may include a low molecular weight organic compound or a high molecular weight organic compound. For example, the low molecular weight organic compound may include copper phthalocyanine, N,N'-diphenylbenzidine, tris-(8-hydroxyquinoline)aluminum, etc., and the high molecular weight organic compound may include poly(3,4-ethylenedioxythiophene), polyaniline, poly-phenylenevinylene, polyfluorene, etc.

In an embodiment, the quantum dot may include a core including a Group II-VI compound, a Group III-V compound, a Group IV-VI compound, a Group IV element, a Group IV compound, and combinations thereof. In an embodiment, the quantum dot may have a core-shell structure including a core and a shell surrounding the core. The shell may serve as a protective layer for maintaining semiconductor properties by preventing chemical modification of the core and as a charging layer for imparting electrophoretic properties to the quantum dot.

The second electrode 180 may be disposed on the emission layer 170. In an embodiment, the second electrode 180 may also be disposed on the eighth insulating layer 108. The second electrode 180 may include a conductive material such as a metal, an alloy, a transparent conductive oxide, or the like. For example, the second electrode 180 may include aluminum (Al), platinum (Pt), silver (Ag), magnesium (Mg), gold (Au), chromium (Cr), tungsten (W), titanium (Ti), or the like. The first electrode 160, the emission layer 170, and the second electrode 180 may form the light emitting element EL.

FIG. 13 is a plan view illustrating an area A in FIG. 7.

Referring to FIGS. 7 and 13, the lower conductive layer BML and the second active layer ACT2 may form the storage capacitor CST in a region where the lower conductive layer BML and the second active layer ACT2 overlap except a region overlapping the write scan line 111. Since the write scan line 111 is disposed between the lower conductive layer BML and the second active layer ACT2, the storage capacitor CST may not be formed in the region overlapping the write scan line 111 inside the region where the lower conductive layer BML and the second active layer ACT2 overlap. The write scan line 111 and the second active layer ACT2 may form the boosting capacitor CBT in a region where the write scan line 111 and the second active layer ACT2 overlap.

At least a part of the first region BA1 of the lower conductive layer BML may overlap an entirety of the body portion BP of the second active layer ACT2. For example, the first region BA1 of the lower conductive layer BML may include a part overlapping the body portion BP of the second active layer ACT2 and another part not overlapping the body portion BP of the second active layer ACT2. In an embodiment, at least a part of the first region BA1 of the lower conductive layer BML may overlap an entirety of the body portion BP of the second active layer ACT2 of the first pixel PX1 and an entirety of the body portion BP of the second active layer ACT2 of the second pixel PX2.

A width of the first region BA1 of the lower conductive layer BML in the first direction DR1 may be greater than a width of the body portion BP of the second active layer ACT2 in the first direction DR1. In an embodiment, a width W1 of the first region BA1 of the lower conductive layer BML in the first direction DR1 may be greater than the sum of a width W3 of the body portion of the second active layer ACT2 of the first pixel PX1 in the first direction DR1, a width W4 of the body portion BP of the second active layer ACT2 of the second pixel PX2 in the first direction DR1, and a gap GP between the body portion BP of the second active layer ACT2 of the first pixel PX1 and the body portion BP of the second active layer ACT2 of the second pixel PX2 in the first direction DR1. Because the width of the first region BA1 of the lower conductive layer BML in the first direction DR1 is greater than the width of the body portion BP of the second active layer ACT2 in the first direction DR1, although the lower conductive layer BML is formed to be shifted in the first direction DR1, at least a part of the first region BA1 of the lower conductive layer BML may overlap an entirety of the body portion BP of the second active layer ACT2. Accordingly, a capacitance of the storage capacitor CST may not change.

A width of the first region BA1 of the lower conductive layer BML in the second direction DR2 may be greater than a width of the body portion BP of the second active layer ACT2 in the second direction DR2. In an embodiment, a width W2 of the first region BA1 of the lower conductive layer BML in the second direction DR2 may be greater than a width W5 of the body portion BP of the second active layer ACT2 of the first pixel PX1 in the second direction DR2 and a width W5 of the body portion BP of the second active layer ACT2 of the second pixel PX2 in the second direction DR2. Because the width of the first region BA1 of the lower conductive layer BML in the second direction DR2 is greater than the width of the body portion BP of the second active layer ACT2 in the second direction DR2, although the lower conductive layer BML is formed to be shifted in the second direction DR2, at least a part of the first region BA1 of the lower conductive layer BML may overlap an entirety of the body portion BP of the second active layer ACT2. Accordingly, a capacitance of the storage capacitor CST may not change.

A width W2 of the first region BA1 of the lower conductive layer BML in the second direction DR2 may be greater than a width W6 of the write scan line 111 in the second direction DR2. In this case, the first region BA1 of the lower conductive layer BML may overlap an entirety of the boost capacitor CBT. Accordingly, although the write scan line 111 is disposed between the lower conductive layer BML and the second active layer ACT2, the storage capacitor CST may be formed in a region not overlapping the write scan line 111 inside a region where the lower conductive layer BML and the body portion BP of the second active layer ACT2 overlap.

An area of the first region BA1 of the lower conductive layer BML may be greater than an area of the body portion BP of the second active layer ACT2. In an embodiment, an area of the first region BA1 of the lower conductive layer BML may be greater than the sum of an area of the body portion BP of the second active layer ACT2 of the first pixel PX1 and an area of the body portion BP of the second active layer ACT2 of the second pixel PX2.

At least a part of the first region BA1 of the lower conductive layer BML may overlap an entirety of the body portion BP of the second active layer ACT2, for example, a width of the first region BA1 of the lower conductive layer BML in the first direction DR1 and the second direction DR2 may be greater than a width of the body portion BP of the second active layer ACT2 in the first direction DR1 and the second direction DR2. Accordingly, in the present invention, although the lower conductive layer BML is formed to be shifted in the first direction DR1 or the second direction DR2, an area where the first region BA1 of the lower conductive layer BML and the second active layer ACT2 overlap may not change, and accordingly, a capacitance of the storage capacitor CST may not change.

The display device according to the embodiments may be applied to a display device included in a computer, a notebook, a mobile phone, a smart phone, a smart pad, a PMP, a PDA, an MP3 player, or the like.

Although the display devices according to the embodiments have been described with reference to the drawings, the illustrated embodiments are examples, and may be modified and changed by a person having ordinary skill in the art without departing from the scope and spirit of the following claims.

What is claimed is:

1. A display device, comprising:
a first semiconductor active layer disposed on a substrate, the first semiconductor active layer including a source and a drain of a first transistor;
a first conductive layer disposed on the first semiconductor active layer, the first conductive layer including a gate pattern and a write scan line, the gate pattern including a gate of the first transistor;
a second semiconductor active layer disposed on the first conductive layer, the second semiconductor active layer including a source and a drain of a third transistor, a source and a drain of a fourth transistor, and a body portion that connects the drain of the third transistor and the drain of the fourth transistor;
a lower conductive layer disposed between the substrate and the first semiconductor active layer and including a first region, at least a part of the first region overlapping an entirety of the body portion of the second semiconductor active layer; and
a light emitting element disposed on the substrate and electrically connected to the drain of the first transistor,
wherein the gate pattern is electrically connected to the body portion,
wherein the body portion overlaps the write scan line, and
wherein the body portion and the write scan line form a boost capacitor.

2. The display device of claim 1, wherein a width of the first region of the lower conductive layer in a first direction is greater than a width of the body portion of the second semiconductor active layer in the first direction.

3. The display device of claim 2, wherein a width of the first region of the lower conductive layer in a second direction intersecting the first direction is greater than a width of the body portion of the second semiconductor active layer in the second direction.

4. The display device of claim 1, wherein an area of the first region of the lower conductive layer is greater than an area of the body portion of the second semiconductor active layer.

5. The display device of claim 1,
wherein the write scan line extends in a first direction, and overlapping a part of the body portion of the second semiconductor active layer.

6. The display device of claim 5, wherein a width of the first region of the lower conductive layer in a second direction intersecting the first direction is greater than a width of the write scan line in the second direction.

7. The display device of claim 1, further comprising:
a first scan line disposed on the first conductive layer and extending in a first direction; and
a second scan line disposed on the second semiconductor active layer, and overlapping the first scan line.

8. The display device of claim 7, wherein the second semiconductor active layer further includes an extension portion extending in a second direction intersecting the first direction from the body portion and positioned between the first scan line and the second scan line, and
wherein a width of the extension portion in the first direction is less than a width of the body portion in the first direction.

9. The display device of claim 7, further comprising:
a gate connection electrode disposed on the second scan line, and connecting the gate pattern and the body portion of the second semiconductor active layer.

10. The display device of claim 9, further comprising:
a connection electrode disposed on a same layer as the gate connection electrode, and connecting the first semiconductor active layer and the second semiconductor active layer.

11. The display device of claim 1, wherein the lower conductive layer is configured to transmit a driving voltage.

12. The display device of claim 1, wherein the lower conductive layer further includes a second region, at least a part of the second region overlapping an entirety of the gate pattern.

13. The display device of claim 1, wherein a material of the first semiconductor active layer is different from a material of the second semiconductor active layer.

14. The display device of claim 13, wherein the first semiconductor active layer includes at least one of amorphous silicon and polysilicon, and
wherein the second semiconductor active layer includes an oxide semiconductor.

15. A display device, comprising:
a first pixel disposed on a substrate;
a second pixel disposed on the substrate, and adjacent to the first pixel in a first direction; and
a lower conductive layer disposed between the substrate and the first pixel, and between the substrate and the second pixel,
wherein each of the first pixel and the second pixel includes:
a first semiconductor active layer disposed on the lower conductive layer, the first semiconductor active layer including a source and a drain of a first transistor;
a first conductive layer disposed on the first semiconductor active layer, the first conductive layer including a gate pattern and a write scan line, the gate pattern including a gate of the first transistor;
a second semiconductor active layer disposed on the first conductive layer, the second semiconductor active layer including a source and a drain of a third transistor, a source and a drain of a fourth transistor, and a body portion that connects the drain of the third transistor and the drain of the fourth transistor; and
a light emitting element disposed on the substrate and electrically connected to the first semiconductor active layer,
wherein the lower conductive layer includes a first region, at least a part of the first region overlapping an entirety of the body portion of the second semiconductor active layer of the first pixel and an entirety of the body portion of the second semiconductor active layer of the second pixel,
wherein the gate pattern is electrically connected to the body portion,
wherein the body portion of each of the first pixel and the second pixel overlaps the write scan line, and
wherein the body portion of each of the first pixel and the second pixel, and the write scan line form a boost capacitor of each of the first pixel and the second pixel.

16. The display device of claim 15, wherein a width of the first region of the lower conductive layer in the first direction is greater than a sum of a width of the body portion of the second semiconductor active layer of the first pixel in the first direction, a width of the body portion of the second semiconductor active layer of the second pixel in the first direction, and a gap between the body portion of the second semiconductor active layer of the first pixel and the body portion of the second semiconductor active layer of the second pixel in the first direction.

17. The display device of claim 16, wherein a width of the first region of the lower conductive layer in a second direction intersecting the first direction is greater than a width of the body portion of the second semiconductor active layer of the first pixel in the second direction and a width of the body portion of the second semiconductor active layer of the second pixel in the second direction.

18. The display device of claim 15, wherein an area of the first region of the lower conductive layer is greater than a sum of an area of the body portion of the second semiconductor active layer of the first pixel and an area of the body portion of the second semiconductor active layer of the second pixel.

19. The display device of claim 15, wherein the first pixel and the second pixel are symmetrical with respect to a second direction intersecting the first direction.

20. The display device of claim 15, wherein the lower conductive layer further includes a second region, at least a part of the second region overlapping an entirety of the gate pattern of the first pixel and an entirety of the gate pattern of the second pixel.

* * * * *